US011929753B1

(12) United States Patent
Chieh et al.

(10) Patent No.: US 11,929,753 B1
(45) Date of Patent: Mar. 12, 2024

(54) NON-LINEAR CHARGE PUMP FOR PHASED LOCK LOOPS

(71) Applicant: United States of America as represented by the Secretary of the Navy, San Diego, CA (US)

(72) Inventors: Jia-Chi Samuel Chieh, San Diego, CA (US); Henry Ngo, San Diego, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 17/931,661

(22) Filed: Sep. 13, 2022

(51) Int. Cl.
*H02M 3/07* (2006.01)
*H03L 7/089* (2006.01)

(52) U.S. Cl.
CPC ............ *H03L 7/0895* (2013.01); *H02M 3/07* (2013.01)

(58) Field of Classification Search
CPC ............................... H03L 7/0895; H02M 3/07
See application file for complete search history.

(56) References Cited

U.S. PATENT DOCUMENTS

| 7,046,093 | B1* | 5/2006 | McDonagh | H03L 7/102 331/34 |
| 2005/0174185 | A1* | 8/2005 | Steinbach | H03L 7/095 331/179 |
| 2007/0075787 | A1* | 4/2007 | Jensen | H03L 7/093 331/17 |
| 2012/0147979 | A1* | 6/2012 | Best | G11C 5/144 375/259 |

\* cited by examiner

*Primary Examiner* — Sibin Chen
(74) *Attorney, Agent, or Firm* — Naval Information Warfare Center, Pacific; Kyle Eppele; Evan Hastings

(57) ABSTRACT

A non-linear charge pump for phased lock loops. Furthermore, an auxiliary charge pump apparatus, comprising a positive switch electrically connected to a current source configured to supplement power to a charge pump, a negative switch electrically connected to a current sink configured to discharge power from the charge pump, a windowing comparator, further comprising an input signal received from a phase-locked loop, a first comparator configured to compare the input signal against a high voltage threshold, a second comparator configured to compare the input signal against a low voltage threshold, an AND logic gate configured to provide a window signal and an activation circuit electrically connected to the positive switch and negative switch. Additionally, a non-linear charge pump system and method for reacquiring frequency lock of a phase lock loop.

14 Claims, 8 Drawing Sheets

NON-LINEAR CHARGE PUMP FOR PHASED LOCK LOOPS

STATEMENT REGARDING FEDERALLY-SPONSORED RESEARCH AND DEVELOPMENT

The United States Government has ownership rights in this invention. Licensing inquiries may be directed to Office of Research and Technical Applications Naval Information Warfare Center Pacific, Code 72120, San Diego, CA, 92152; telephone (619) 553-5118; email: niwc_patent.fct@us.navy.mil, referencing Navy Case 113,239.

FIELD OF USE

The present disclosure pertains generally to phase locked loops and auxiliary charge pumps for uses including, but not limited to, radiation hardening, requiring frequency lock, and frequency reference.

BACKGROUND

Phase lock loops ("PLL") are commonly used in communication systems and circuits to generate a high frequency clock reference source, with very low jitter or phase noise. In a phase lock loop, the voltage on the control pin of the voltage controlled oscillator ("VCO") is highly susceptible to single-event transients ("SET"). During a SET event, a radiation particle may strike a voltage node and cause charge to be injected. PLLs typically have a control line, which may be disrupted by the SET and cause the PLL to lose lock. To remedy the disruption, the PLL needs to quickly reacquire frequency lock. Typically, frequency lock is reacquired with a charge pumps. However, charge pumps are limited in their effectiveness based on a number of factors, including the power source available to the charge pump. Even if one were to increase the power available to a charge pump, it would love reacquisition time to achieve frequency lock, but also increases jitter, which may include thermal noise or flicker noise. Therefore, current PLLs are hindered by a trade-off between reacquisition time and jitter that limits their overall effectiveness to quickly require phase lock.

SUMMARY

It is an object to provide a Non-linear Charge Pump for Phased Lock Loops that offers numerous benefits, including quickly acquiring frequency lock for PLLs by dynamically adjusting the bandwidth of the loop, which can allow a PLL to recover at a faster rate. Such a benefit is highly desirable for uses including, but not limited to, radiation hardening and frequency reference in communication systems.

A non-linear charge pump for phased lock loops. Furthermore, an auxiliary charge pump apparatus, comprising a positive switch electrically connected to a current source configured to supplement power to a charge pump, a negative switch electrically connected to a current sink configured to discharge power from the charge pump, a windowing comparator, further comprising an input signal received from a phase-locked loop, a first comparator configured to compare the input signal against a high voltage threshold, a second comparator configured to compare the input signal against a low voltage threshold, an AND logic gate configured to provide a window signal and an activation circuit electrically connected to the positive switch and negative switch. Additionally, a non-linear charge pump system and method for reacquiring frequency lock of a phase lock loop.

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

The accompanying drawings, which are incorporated in and form a part of the specification, illustrate example embodiments and, together with the description, serve to explain the principles of the invention. Throughout the several views, like elements are referenced using like references. The elements in the figures are not drawn to scale and some dimensions are exaggerated for clarity. In the drawings.

DETAILED DESCRIPTION OF EMBODIMENTS

The disclosed apparatus, system, and method below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other apparatus and system, and method described herein as will be understood by one of ordinary skill in the art unless otherwise stated specifically.

References in the present disclosure to "one embodiment," "an embodiment," or any variation thereof, means that a particular element, feature, structure, or characteristic described in connection with the embodiments is included in at least one embodiment. The appearances of the phrases "in one embodiment," "in some embodiments," and "in other embodiments" in various places in the present disclosure are not necessarily all referring to the same embodiment or the same set of embodiments.

As used herein, the terms "comprises," "comprising," "includes," "including," "has," "having," or any variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of words such as "the," "a," or "an" are employed to describe elements and components of the embodiments herein; this is done merely for grammatical reasons and to conform to idiomatic English. This detailed description should be read to include one or at least one, and the singular also includes the plural unless it is clearly indicated otherwise.

Figure 1:
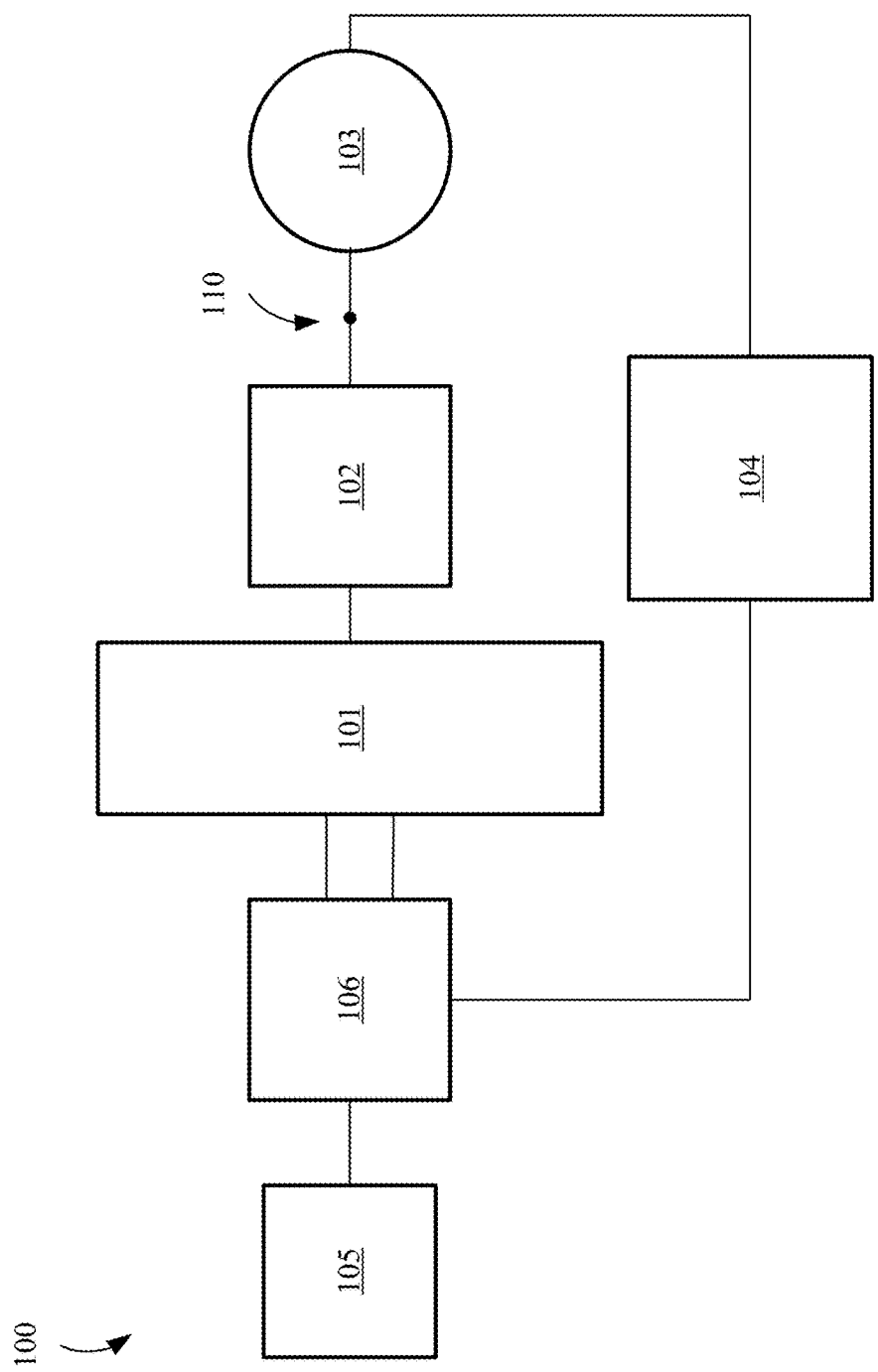
FIG. 1 is an example illustration of a phase lock loop.

FIG. 1 is an example of a phase lock loop comprising a voltage control operator ("VCO") 103, frequency divider 104, temperature compensated crystal oscillator ("TCXO") 105, phase detector 106, charge pump 101, loop filter 102, and control voltage ("$V_{ctrl}$") node 110. The VCO 103 may provide an output signal variable over a specific frequency range and whose output frequency is related to the voltage applied at its input. The frequency divider 104 is configured to lock the VCO 103 frequency to the low TCXO 105 frequency by dividing it down via an integer. The TXCO 105 provides a low frequency and, for example, may comprise a high purity crystal. The phase detector 106 may either have a leading or lagging phase and may generate an output voltage of up or down depending on whether the phase is leading or lagging. The charge pump 101 may be toggled on or off, and uses capacitors for energetic charge storage to raise or lower voltage. The loop filter 102 may remove any components of the signals of which the phase is being compared from a reference and control voltage 110 and comprises a plurality of capacitors. Finally, the control voltage node 110 may be monitored to ensure that the PLL 100 remains in a particular range of frequency lock.

The PLL 100 dynamics are described by the variables of natural frequency ("$\omega_n$"), dampening factor ("$\zeta$") and bandwidth of the loop at, for example, 3 decibels ($\omega_{-3\ dB}^2$). Natural frequency is defined by factors comprising current, capacitance, and slope profile of the VCO 103 in the following equation:

$$\omega_n = \sqrt{\frac{I_p K_{vco}}{2\pi C_p}}.$$

Additionally, dampening factor can be determined via:

$$\zeta = \frac{R_p}{2}\sqrt{\frac{I_p C_p K_{vco}}{2\pi}}.$$

Finally, the bandwidth of the loop at 3 decibels is: $\omega_{-3\ dB}^2 = [(2\zeta^2+1)+\sqrt{(2\zeta^2+1)^2+1}]\omega_n^2$. By dynamically adjusting the bandwidth of a loop, acquisition time of frequency lock may be improved.

PLLs 100 are commonly used in communication systems, radio systems, and more, as a frequency reference. However, external conditions including, but not limited to, temperature and radiation may cause the PLL 100 to lose its phase lock. PLLs 100 are commonly considered an analog circuit, and as such may take some time to acquire a frequency lock. Frequency lock is acquired through a feedback loop where the frequency of an internal oscillator in the PLL 100 is compared to a reference signal, which may be a crystal oscillator. The VCO 103 the may react to a perturbation of the PLL 100 and adjust and relock. Such a disruption may be detected on the voltage control node 110 within the loop filter 102. Requiring phase lock after a disruption is depending on the current source 202. By dynamically adjusting the bandwidth of the loop, reacquisition time may be improved.

Figure 2:
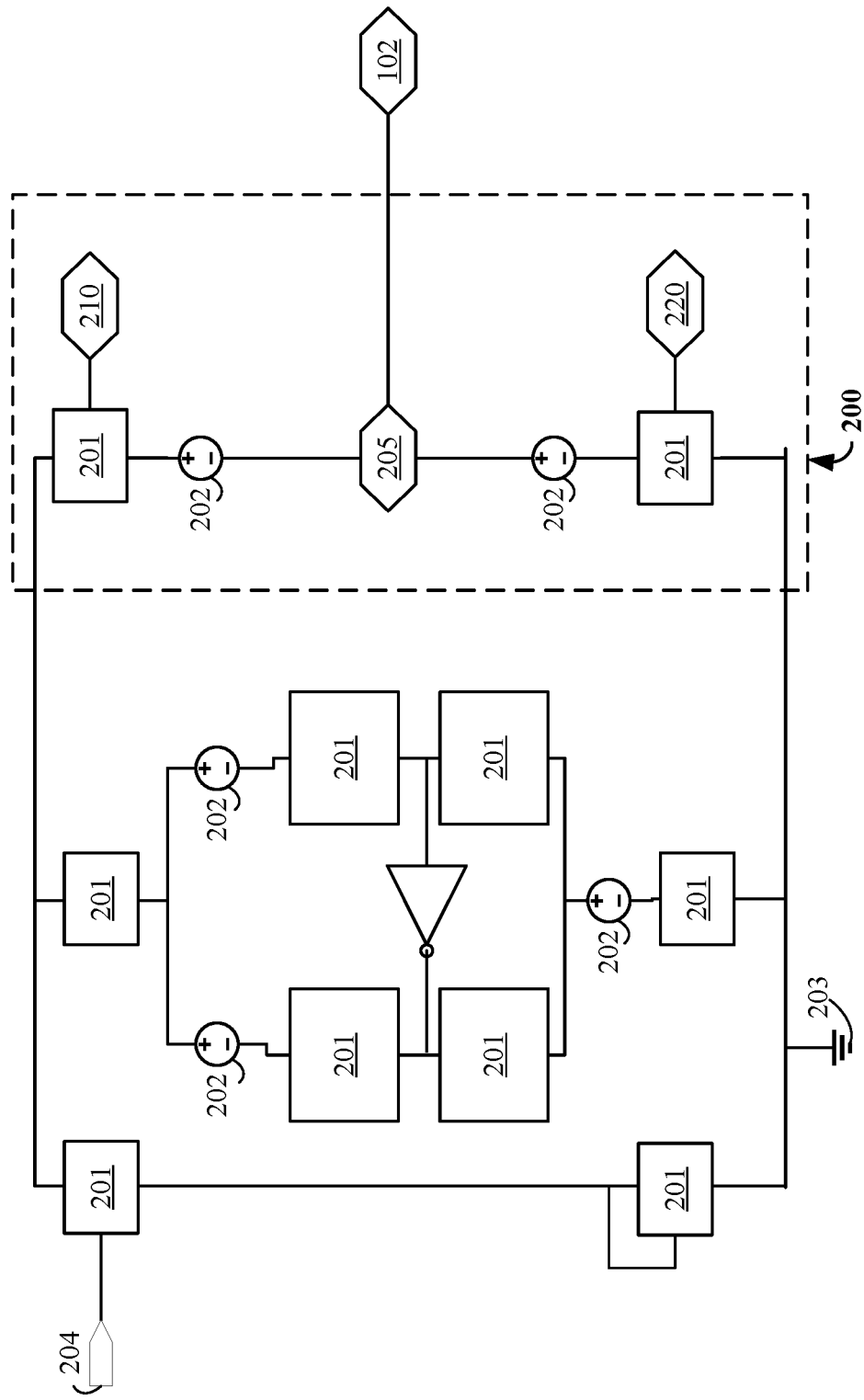
FIG. 2 is an example illustration of a charge pump and auxiliary charge pump.

FIG. 2 is an illustration of a charge pump 101 electrically connected to an auxiliary charge pump 200. The charge pump comprises a plurality of switches 201, a plurality of current sources 202, and a plurality of current sinks 203. The plurality current sources 202 or current sinks 203 may charge or discharge the plurality of capacitors in the loop filter to ramp up/down voltage. Moreover, the charge pump further comprises an IN node 204, electrically connected to the phase detector 106, and an OUT node 205, which is electrically connected to the auxiliary charge pump 200 and loop filter 102.

The auxiliary charge pump 200 comprises a plurality of switches 201 directly tied to the current source 202 and current sink rails 203. In one embodiment at least one of the plurality of switches 201 is a positive metal-oxide-semiconductor field-effect transistor ("PMOS") and at least one of the plurality of switches 201 is a negative metal-oxide-semiconductor field-effect transistor ("NMOS"). When each of the plurality of switches 201 are activated, then the control voltage may pull power up or down at a greater rate than the primary charge pump 101. The auxiliary charge pump 200 may also provide and auxiliary UP signal ("UP X") 210 or auxiliary down signal ("DOWN X") 220. The auxiliary charge pump 200 may be activated when the control voltage 110 is outside a threshold window, which may be set by the user or external party. This allows for the charge pump 101 to handle a certain window of variation, but utilize the benefits of the auxiliary charge pump 200 when the control voltage leaves that certain window. The control voltage 110 may have a nominal voltage of mid-rail. When the control voltage 110 is, for example, the threshold may be +/−33% the value at mid-rail (i.e. 0.6V). In this example, $V_{High}$ may be 0.8V and $V_{Low}$ may be 0.4V. Accordingly, when the control voltage exceeds the high voltage threshold of 0.8V, the auxiliary charge pump may be activated and sink power to assist in the reacquisition of frequency lock in the PLL 100. Alternatively, when the control voltage 110 dips below the low voltage threshold of 0.4V, the auxiliary charge pump 200 may be activated and supplement power to assist in the reacquisition of frequency lock in the PLL 100.

Figure 3:
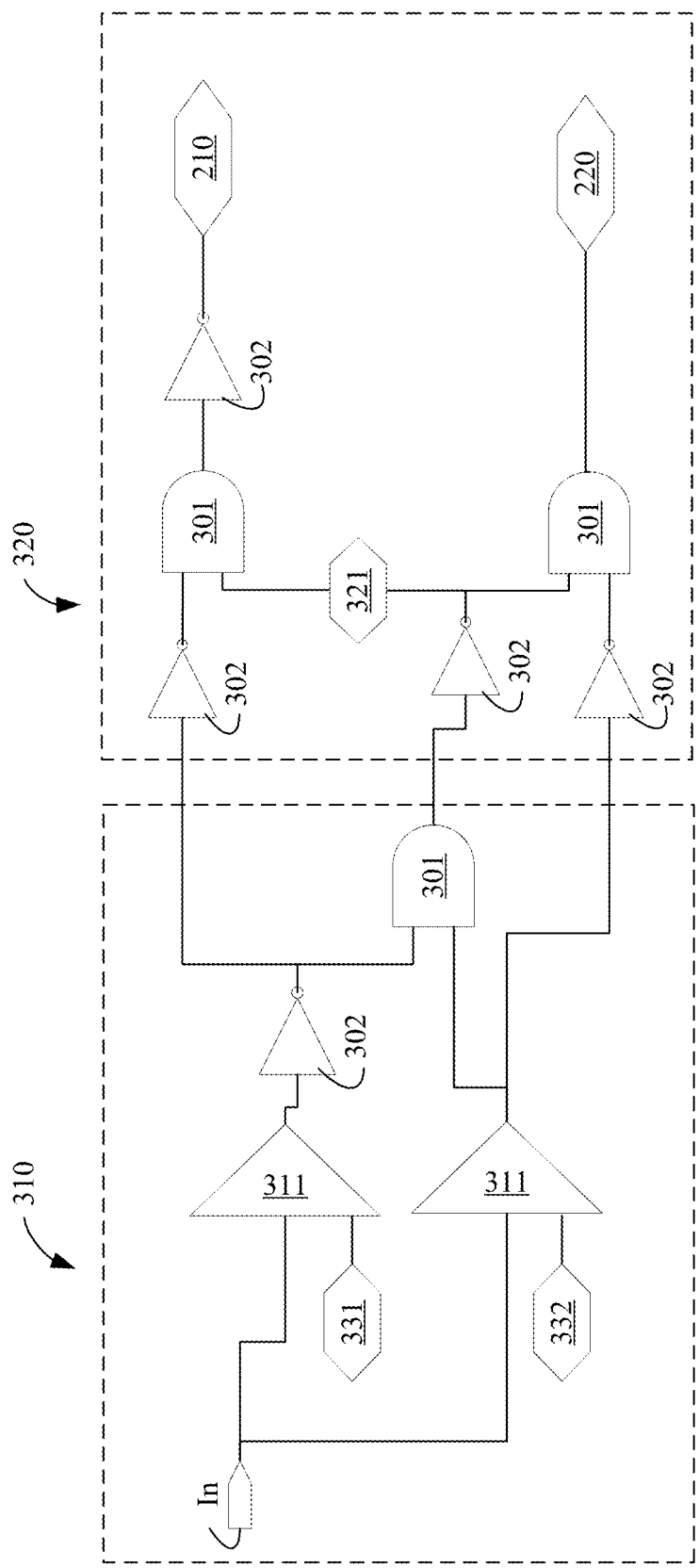
FIG. 3 is an example illustration of the activation circuit, comprising a windowing comparator and activation logic.

FIG. 3 is an illustration of the activation circuit comprising a windowing comparator 310 activation logic 320, each further comprising a plurality of AND gates 301, and a plurality of inverters 302. The windowing comparator 310 may compare an input signal to determine whether an auxiliary charge pump 200 should be activated and the activation logic activates the auxiliary charge pump 200. Additionally, the windowing comparator 310 may further comprise a plurality of high speed comparators 311. Each of the plurality of high speed comparators have a user defined voltage level to set the threshold for which the auxiliary pump should be activated. In other words, a user may define a window for the charge pump 101, outside of which, the auxiliary charge pump is activated. For example, an activation threshold may be +/−33% of the mid-rail. However, the activation threshold may set to any voltage within the comparator. In one embodiment, one may determine a low or high threshold by optimizing for the VCO to be linear, because it is generally preferable to operate in a linear regime.

In one embodiment, at least one comparator compares the input signal against a known high voltage threshold ("$V_{High}$") 332. This first comparator has a NMOS differential input pair. Furthermore, a second comparator may compares the input signal against a known low voltage threshold ("$V_{Low}$") 331. The second comparator may have a PMOS differential input pair. The output signals from at least these two comparators then go into a "AND" gate, to provide a window signal 321. The output of the first comparator and the inverted window signal then provide the control UP X signal for the auxiliary charge pump. The output of the second comparator and the inverted window signal, provide the control DOWN X signal for the auxiliary charge pump.

Moreover, the activation circuit generates signals to engage the auxiliary charge pump and switches. Generating signal to engage the auxiliary charge pump 200 is important because it mediates the interaction between the charge pump 101 and the auxiliary charge pump 200. The thresholds determine the window in which the charge pump 101 is left to reacquire phase lock without an assistance, and when the auxiliary charge pump 200 begins to participate. Supplemental power provided by the auxiliary charge pump 200 may then assist the PLL to reacquire phase lock. Accordingly, the activation circuit provides the specific timing and circumstances for which the auxiliary charge pump to intervene.

Figure 4:
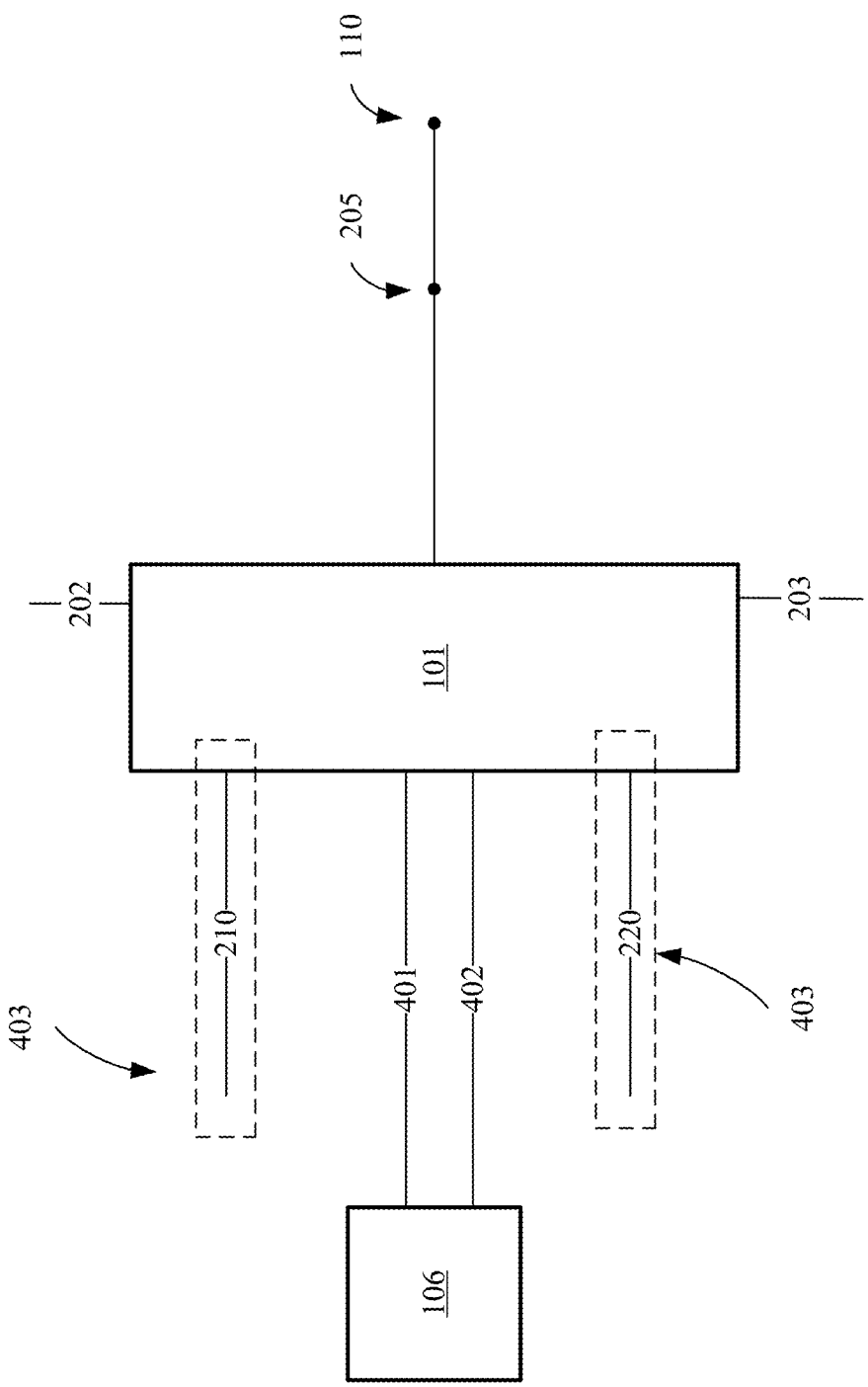
FIG. 4 is an example illustration electrically connecting the auxiliary charge pump to the charge pump via auxiliary hooks.

FIG. 4 is an example illustration of one embodiment of electrically connecting the auxiliary charge pump 200 to the charge pump 101. In one embodiment, the auxiliary charge pump 200 is electrically connected to the charge pump 101 via auxiliary hooks 403, as shown in FIG. 4. The windowing comparator 310 provides the UP X 210 and DOWN X 220 signals from the auxiliary charge pump 200 to the charge pump 101. The auxiliary hooks 403 are configured to provide supplemental charge or discharge to the charge pump 101. Furthermore, the phase frequency detector 106 provides the standard UP 401 and DOWN 402 signals to the primary charge pump. Finally, the OUT node 205 may be electrically connected to a control voltage 110.

Figure 5:
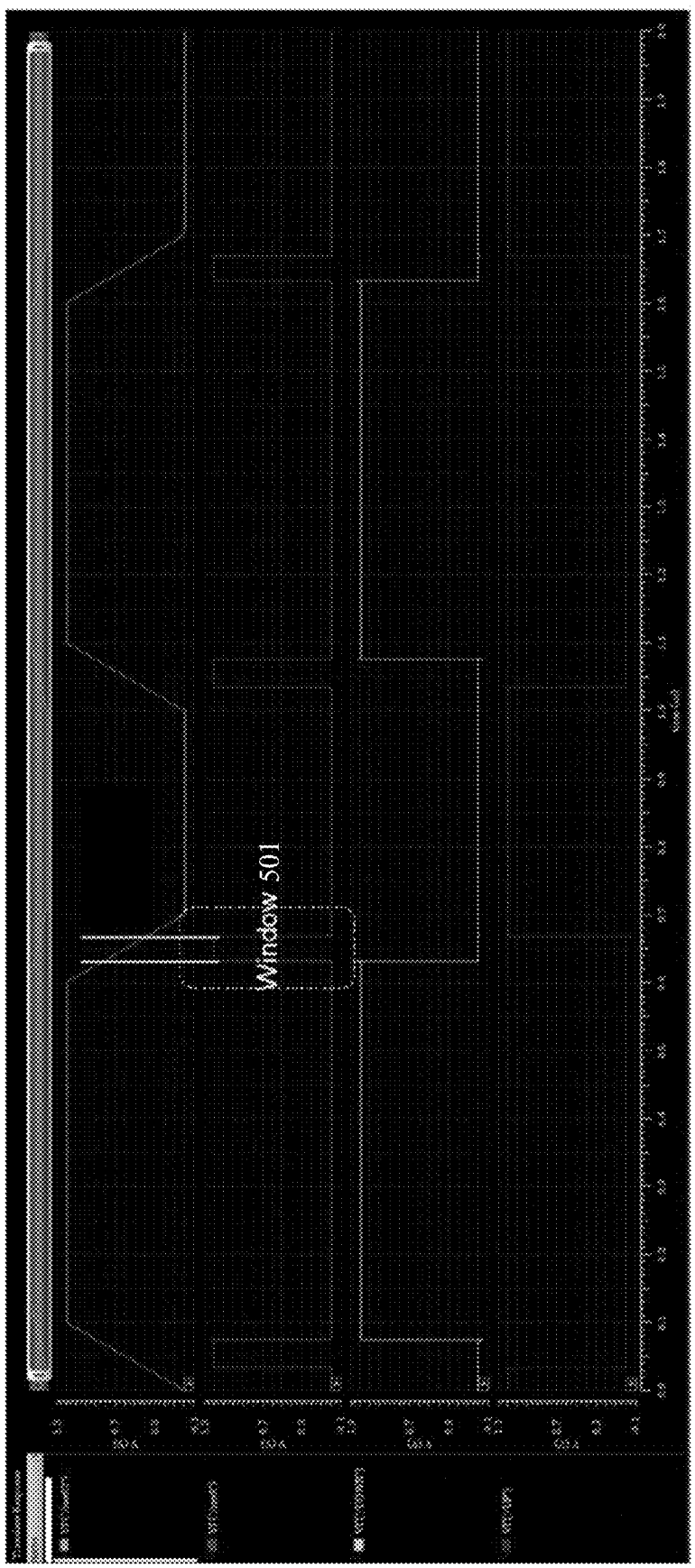
FIG. 5 is a graphical demonstration showing a test input signal, the output window signal, an up signal, and a down signal.

FIG. 5 is a graphical demonstration of a test input signal, $V_{ctrl}$ ("net02"), the window signal ("net8"), the "UP" signal, and the "DOWN" control signal. In particular, FIG. 5 is illustrative of the window signal and its activation within a specified activation threshold. For example, the window signal is activated in FIG. 5 at a $V_{low}$ of 0.4V and a $V_{high}$ of 0.8. Inside of the window, there is normal charge pump 101 operation. Outside of the window, the activation circuit will enable the auxiliary charge pump 200 to ramp $V_{ctrl}$ up or down to return it to the normal range. The $V_{low}$ ow to $V_{high}$ activation window may be widened or narrowed depending on how fast one desires an auxiliary charge pump 200 to be engaged.

Figure 6A:
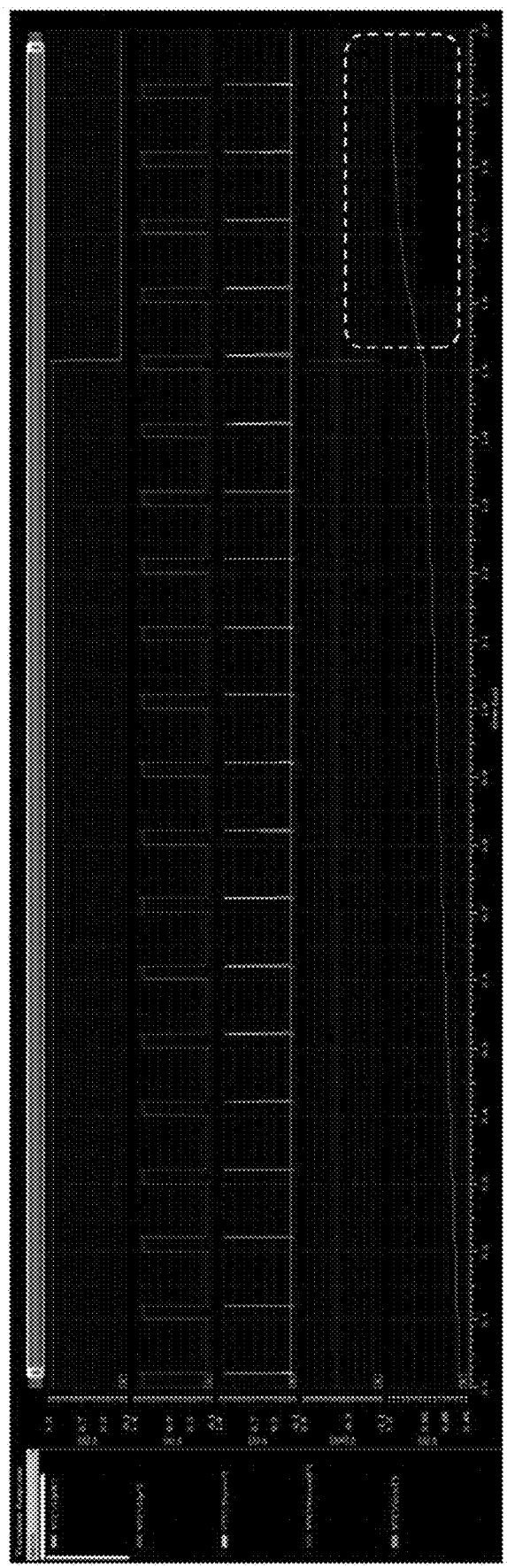
FIG. 6A is a graphical demonstration of ramping up, wherein the auxiliary charge pump is activated at the high voltage threshold.
Figure 6B:
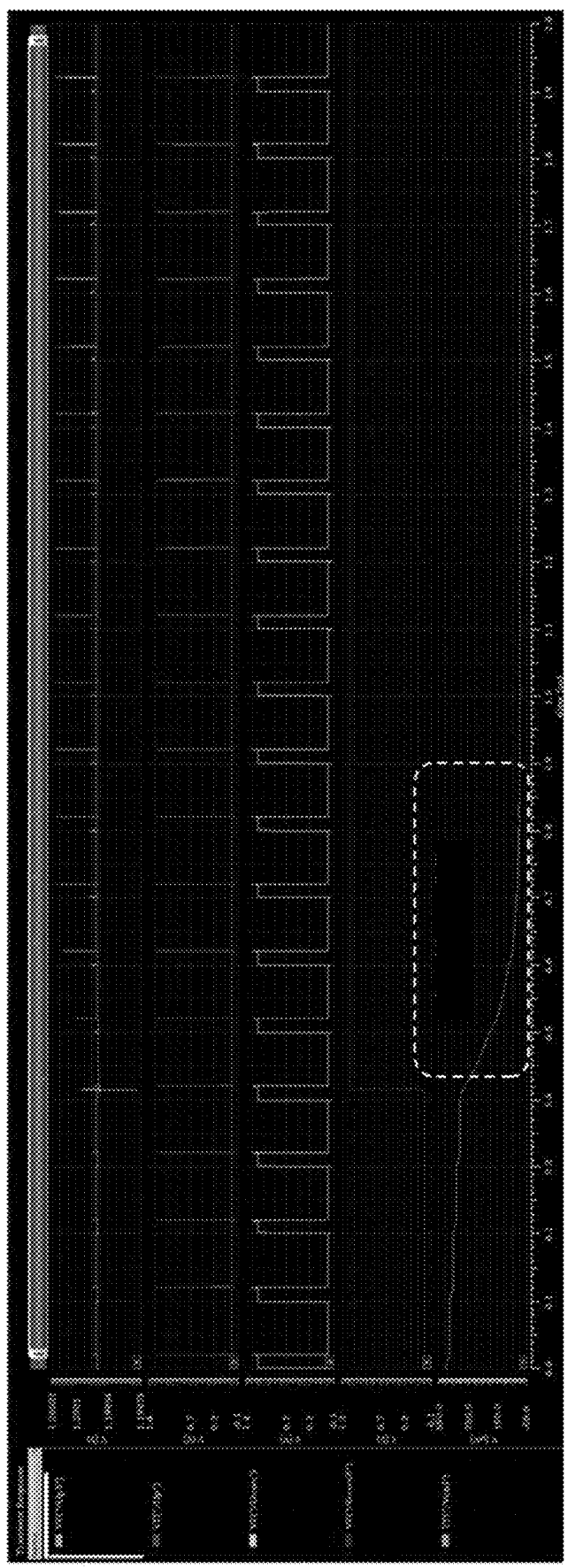
FIG. 6B is a graphical demonstration of ramping down, wherein the auxiliary charge pump is activated at the low voltage threshold.

FIGS. 6A and 6B show graphical simulations of the ramping up and ramping down of a control voltage with an auxiliary charge pump. The sections of the graphs in FIGS. 6A and 6B that are surrounded with a dash-line box indicate where instances where the auxiliary charge pump 200 has been activated. For example, FIG. 6A demonstrates exceeding a high voltage threshold of 0.8V, but this disclosure is not so limited. Moreover, FIG. 6B simulation demonstrate exceeding a low voltage threshold of 0.4V but, similarly, is no so limited. The horizontal axis of each graph displays time, in microseconds, to display the voltage over time. The measured voltages are: control voltage ("$V_{ctrl}$") 110, UP 401, DOWN 402, and UP X 210, DOWN X 220.

In FIG. 6A, as the control voltage 110 exceeds 0.8V, the auxiliary charge pump 200 ramps up and supplements the rate at which the voltage increases. The increased ramp up speed is due to the supplemental current source, and, therefore, the charge pump 101 is not throttled by its own current source 202. Alternatively, as shown in FIG. 6B, as the control voltage 110 drops below 0.4V, the auxiliary charge pump 200 kicks in and increases the rate of voltage decay. Again, this is because the auxiliary charge pump 200 is directly connected to the current supply and, therefore, not throttled. Accordingly, one benefit is that if the control voltage undergoes a disruption (i.e. a single-event transient) and there is perturbation, the auxiliary charge pump 200 can react quicker when it is outside its nominal range. Within the nominal range, the windowing comparator 310 circuit shuts down the auxiliary charge pump 200 and therefore returns to normal operation.

In one embodiment, activating the auxiliary charge pump may dynamically change the bandwidth of the PLL 100. The bandwidth of the loop may be increased by increasing the current from the charge pump. This lowers the acquisition time required for the PLL 100 to achieve frequency lock. However, increasing current from the charge pump also increases jitter, which may include thermal noise or flicker noise. When the bandwidth is low, the acquisition time is high, but the jitter is low. With the addition of an auxiliary charge pump 200, as described herein, both low acquisition time as well as low jitter are achievable.

Figure 7:
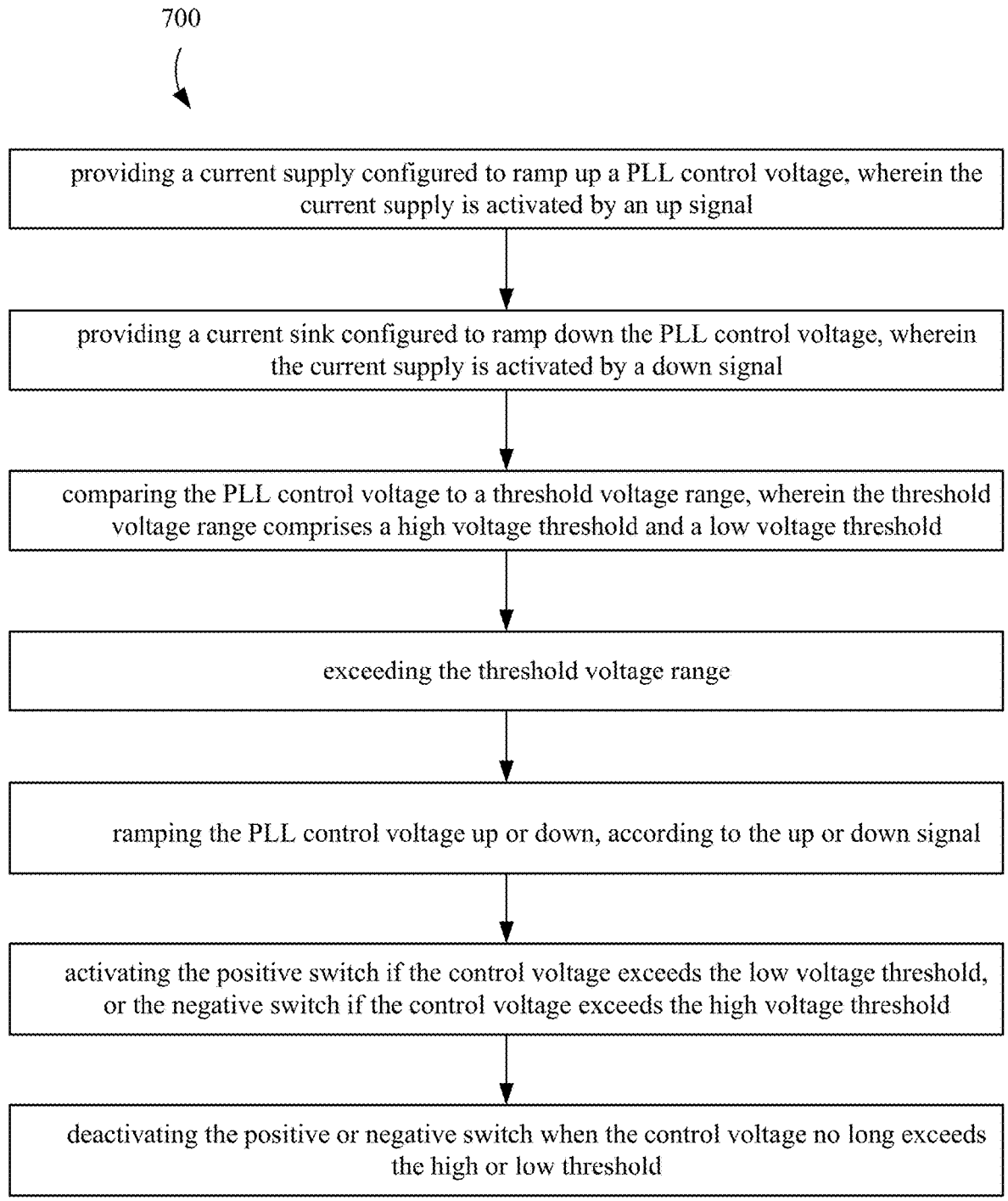
FIG. 7 is a block diagram illustration of method for reacquiring frequency lock of a phase lock loop.

FIG. 7 is a method 700 for reacquiring frequency lock of a phase lock loop, the steps comprising A method for reacquiring frequency lock of a phase lock loop ("PLL"), the steps comprising: providing a current supply configured to ramp up a PLL control voltage, wherein the current supply is activated by an up signal; providing a current sink configured to ramp down the PLL control voltage, wherein the current supply is activated by a down signal; comparing the PLL control voltage to a threshold voltage range, wherein the threshold voltage range comprises a high voltage threshold and a low voltage threshold; exceeding the threshold voltage range; activating the up signal if the control voltage exceeds the low voltage threshold, or the down signal if the control voltage exceeds the high voltage threshold; ramping the PLL control voltage up or down, according to the up or down signal; deactivating the positive or negative switch when the control voltage no long exceeds the high or low threshold.

Furthermore, the method of reacquiring frequency lock of a PLL may include: wherein the disruption event is a single-event transient. Alternatively, wherein the disruption event is caused by a change in temperature. Alternatively, wherein the positive switch is a positive metal-oxide-semiconductor field-effect transistor. Alternatively, wherein the negative switch is a negative metal-oxide-semiconductor field-effect transistor. Alternatively, wherein the high voltage threshold is thirty-three percent more than the nominal value of mid-rail voltage, and the low voltage threshold is thirty-three percent more than the nominal value of mid-rail voltage.

From the above description of Non-linear Charge Pump for Phased Lock Loops, it is manifest that various techniques may be used for implementing the concepts of an auxiliary pump apparatus, non-linear charge pump system, and a method for reacquiring frequency lock of a phase lock loop without departing from the scope of the claims. The described embodiments are to be considered in all respects as illustrative and not restrictive. The apparatus/system/method disclosed herein may be practiced in the absence of any element that is not specifically claimed and/or disclosed herein. It should also be understood that auxiliary pump apparatus, non-linear charge pump system, and a method for reacquiring frequency lock of a phase lock loop is not limited to the particular embodiments described herein, but is capable of many embodiments without departing from the scope of the claims.

What is claimed:

1. An auxiliary charge pump apparatus, comprising:
   a positive switch having a direct, unmediated connection to an external power supply configured to supplement power to a charge pump, wherein the auxiliary charge pump has a direct, unmediated connection to the charge pump;
   a negative switch having a direct, unmediated connection to an external ground configured to discharge power from the charge pump, wherein the auxiliary charge pump has a direct, unmediated connection to the charge pump;
   a windowing comparator, further comprising:
      an input signal received from a phase-locked loop;
      a first high speed comparator configured to compare the input signal against a high voltage threshold, wherein the first high speed comparator generates a down signal if the input signal exceeds the high voltage threshold, and wherein the high voltage threshold is set externally;
      a second high speed comparator configured to compare the input signal against a low voltage threshold, wherein the second high speed comparator generates an up signal if the input signal exceeds the low voltage threshold, and wherein the low voltage threshold is set externally;
      an AND logic gate configured to provide a window signal; and
   an activation circuit electrically connected to the positive switch and negative switch, configured to activate the positive switch if the second high speed comparator generates the up signal, or to activate the negative switch if the first high speed comparator generates the down signal.

2. The auxiliary charge pump apparatus of claim 1, wherein the up signal further comprises an inverted window signal.

3. The auxiliary charge pump apparatus of claim 1, wherein the down signal further comprises the window signal.

4. The auxiliary charge pump apparatus of claim 1, wherein the direct, unmediated connection to the charge pump further comprises:
   a plurality of auxiliary hooks configured to electrically connect the auxiliary charge pump to the charge pump.

5. The auxiliary charge pump apparatus of claim 1, wherein the positive switch is a positive metal-oxide-semiconductor field-effect transistor.

6. The auxiliary charge pump apparatus of claim 1, wherein the negative switch is a negative metal-oxide-semiconductor field-effect transistor.

7. The auxiliary charge pump apparatus of claim 1, wherein the high voltage threshold is thirty-three percent more than the nominal value of mid-rail voltage.

8. The auxiliary charge pump apparatus of claim 1, wherein the low voltage threshold is thirty-three percent less than the nominal value of mid-rail voltage.

9. An non-linear charge pump system, comprising:
   a charge pump configured to raise or lower voltage of a phase locked loop;
   an auxiliary charge pump having a direct, unmediated connection to the charge pump, further comprising:
      a positive switch having an direct, unmediated connection to an external power supply configured to supplement power to the charge pump;
      a negative switch having an direct, unmediated connection to an external ground configured to discharge power from the charge pump;
      a windowing comparator, further comprising:
         an input signal received from the phase-locked loop;
         a first high speed comparator configured to compare the input signal against a high voltage threshold, wherein the first high speed comparator generates an up signal if the input signal exceeds the high voltage threshold;
         a second high speed comparator configured to compare the input signal against a low voltage threshold, wherein the second high speed comparator generates a down signal if the input signal exceeds the low voltage threshold;
         an AND logic gate configured to provide a window signal; and
      an activation circuit electrically connected to the positive switch and negative switch, configured to activate the positive switch if the second high speed comparator generates the up signal, or to activate the negative switch if the first high speed comparator generates the down signal.

10. The auxiliary charge pump apparatus of claim 9, wherein the up signal further comprises an inverted window signal.

11. The auxiliary charge pump apparatus of claim 9, wherein the down signal further comprises a window signal.

12. The auxiliary charge pump apparatus of claim 9, further comprising:
   a plurality of auxiliary hooks to electrically connect the auxiliary charge pump to the charge pump.

13. The non-linear charge pump system of claim 9, wherein the positive switch is a positive metal-oxide-semiconductor field-effect transistor.

14. The non-linear charge pump system of claim 9, wherein the negative switch is a negative metal-oxide-semiconductor field-effect transistor.

* * * * *